United States Patent
Choi et al.

(10) Patent No.: US 9,614,491 B2
(45) Date of Patent: Apr. 4, 2017

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Kang Ryong Choi, Suwon-Si (KR); Il Jin Park, Suwon-Si (KR); Sung Yong An, Suwon-Si (KR); Jung Wook Seo, Suwon-Si (KR); Myeong Gi Kim, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 105 days.

(21) Appl. No.: 14/745,319

(22) Filed: Jun. 19, 2015

(65) Prior Publication Data

US 2015/0371781 A1 Dec. 24, 2015

(30) Foreign Application Priority Data

Jun. 24, 2014 (KR) ........................ 10-2014-0077160

(51) Int. Cl.
*H03H 7/01* (2006.01)
*H01G 4/40* (2006.01)
(Continued)

(52) U.S. Cl.
CPC ....... *H03H 7/0115* (2013.01); *H01F 27/2804* (2013.01); *H01G 4/30* (2013.01); *H01G 4/40* (2013.01); *H03H 2001/0085* (2013.01)

(58) Field of Classification Search
CPC ......... H03H 2001/0085; H03H 7/0115; H01G 4/40; H01G 4/30; H01F 27/2804
(Continued)

(56) References Cited

U.S. PATENT DOCUMENTS

| 2003/0030510 | A1 | 2/2003 | Sasaki et al. |
| 2004/0202823 | A1* | 10/2004 | Yoshikawa ............ B32B 18/00 428/174 |
| 2014/0266093 | A1* | 9/2014 | Isham .................. H02M 3/158 323/271 |

FOREIGN PATENT DOCUMENTS

| JP | 06-325977 A | 11/1994 |
| JP | 08-242136 A | 9/1996 |

(Continued)

OTHER PUBLICATIONS

Korean Office Action issued in Korean Patent Application No. 10-2014-0077160, issued Dec. 8, 2015.

*Primary Examiner* — Stephen E Jones
*Assistant Examiner* — Rakesh Patel
(74) *Attorney, Agent, or Firm* — McDermott Will & Emery LLP

(57) ABSTRACT

A composite electronic component includes a composite body containing a capacitor and an inductor coupled to each other, the capacitor including a ceramic body having a plurality of dielectric layers and first and second internal electrodes, and the inductor including a magnetic body including a coil part, an input terminal disposed on a first end surface of the composite body and connected to the coil part, an output terminal including first output terminals disposed on a second end surface of the composite body and connected to the coil part and a second output terminal disposed on a second side surface of the composite body and connected to the first internal electrodes, and a ground terminal disposed on a first side surface of the composite body. The capacitor and the inductor are coupled in a vertical direction, and a magnetic metal layer is provided between the inductor and the capacitor.

20 Claims, 14 Drawing Sheets

(51) Int. Cl.
*H01G 4/30* (2006.01)
*H01F 27/28* (2006.01)
*H03H 1/00* (2006.01)

(58) Field of Classification Search
USPC .................................................. 333/175, 185
See application file for complete search history.

(56) References Cited

FOREIGN PATENT DOCUMENTS

| JP | 10-241947 | 9/1998 |
| KR | 2003-0014586 A | 2/2003 |
| KR | 20140038911 A | 3/2014 |

\* cited by examiner

A-A'

A-A'

A-A'

A-A'

COMPOSITE ELECTRONIC COMPONENT AND BOARD HAVING THE SAME

CROSS-REFERENCE TO RELATED APPLICATION

This application claims the priority and benefit of Korean Patent Application No. 10-2014-0077160 filed on Jun. 24, 2014, with the Korean Intellectual Property Office, the disclosure of which is incorporated herein by reference.

BACKGROUND

The present disclosure relates to a composite electronic component including a plurality of passive devices and a board having the same.

In accordance with a demand for thinness and lightness in electronic apparatuses and improvements in the performance of electronic apparatuses, electronic apparatuses have been required to have a significantly decreased size and increased functionality.

Such electronic apparatuses include a power semiconductor-based power management integrated circuit (PMIC) serving to efficiently control and manage limited battery resources in order to satisfy various service requirements.

However, as electronic apparatuses have come to include various functions, the number of direct current (DC) to DC converters included in PMICs has increased. In addition, the number of passive devices included in a power input terminal and a power output terminal of the PMIC has also increased.

In this case, areas of electronic apparatuses occupied by components are inevitably increased, which may limit the degree to which such electronic apparatuses are able to be miniaturized.

In addition, a large amount of noise may be generated due to the PMIC and wiring patterns of circuits provided peripherally to the PMIC.

In order to solve the above-mentioned problems, research into a composite electronic component in which an inductor and a capacitor are coupled to each other in a vertical manner has been conducted, such that effects such as a decrease of an area in which the components are disposed in the electronic apparatus and the suppression of noise generation have been obtained.

However, in a case in which the inductor and the capacitor are coupled to each other, interference may be generated between an external terminal of the inductor and an external terminal or an internal electrode of the capacitor, leading to the generation of parasitic capacitance, such that problems in which a self resonant frequency (SRF) is lowered and a quality (Q) factor is deteriorated may occur.

In addition, eddy loss may be generated in the internal electrode of the capacitor due to magnetic flux generated by the inductor, such that efficiency may be decreased.

RELATED ART DOCUMENT (Patent Document 1) Korean Patent Laid-Open Publication No. 10-2003-0014586

SUMMARY

An aspect of the present disclosure may provide a composite electronic component allowing for efficient use of available mounting space in a driving power supply system, and a board having the same.

An aspect of the present disclosure may also provide a composite electronic component capable of suppressing the generation of noise in a driving power supply system, and a board having the same.

According to an aspect of the present disclosure, a composite electronic component may include a composite body in which a capacitor and an inductor are coupled to each other, the capacitor including a ceramic body in which a plurality of dielectric layers and first and second internal electrodes, having respective dielectric layers interposed therebetween and facing each other, are stacked, and the inductor including a magnetic body including a coil part, an input terminal disposed on a first end surface of the composite body in a length direction, an output terminal including first output terminals disposed on a second end surface of the composite body in the length direction and a second output terminal disposed on a second side surface of the composite body in a width direction, and a ground terminal disposed on a first side surface of the composite body in the width direction, wherein the capacitor and the inductor are coupled to each other in a vertical direction, and a magnetic metal layer is provided between the inductor and the capacitor.

According to another aspect of the present disclosure, a composite electronic component may include a composite body in which a capacitor and an inductor are coupled to each other, the capacitor including a ceramic body in which a plurality of dielectric layers and first and second internal electrodes, having respective dielectric layers interposed therebetween and facing each other, are stacked, and the inductor including a magnetic body including a coil part, wherein the capacitor and the inductor are coupled to each other in a vertical direction, the inductor includes the coil part and cover layers disposed on upper and lower surfaces of the coil part, respectively, and a magnetic metal layer is disposed on the uppermost portion of the cover layer adjacent to the capacitor.

According to another aspect of the present disclosure, a composite electronic component may include a power stabilizing unit including a composite body in which a capacitor and an inductor are coupled to each other and a magnetic metal layer is provided between the inductor and the capacitor, the capacitor including a ceramic body in which a plurality of dielectric layers and first and second internal electrodes, having respective dielectric layers interposed therebetween and facing each other, are stacked and the inductor including a magnetic body including a coil part, an input terminal disposed on a first end surface of the power stabilizing unit in a length direction, an output terminal including first and second output terminals disposed on a second end surface of the power stabilizing unit in the length direction and a second side surface of the power stabilizing unit in a width direction, and a ground terminal disposed on a first side surface of the power stabilizing unit in the width direction, wherein the inductor suppresses an AC component of received power and the capacitor decreases ripple in the received power.

According to another aspect of the present disclosure, a board having a composite electronic component may include a printed circuit board having three or more electrode pads disposed on the printed circuit board, the composite electronic component as described above, installed on the printed circuit board, and solders connecting the electrode pads and the composite electronic component to each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
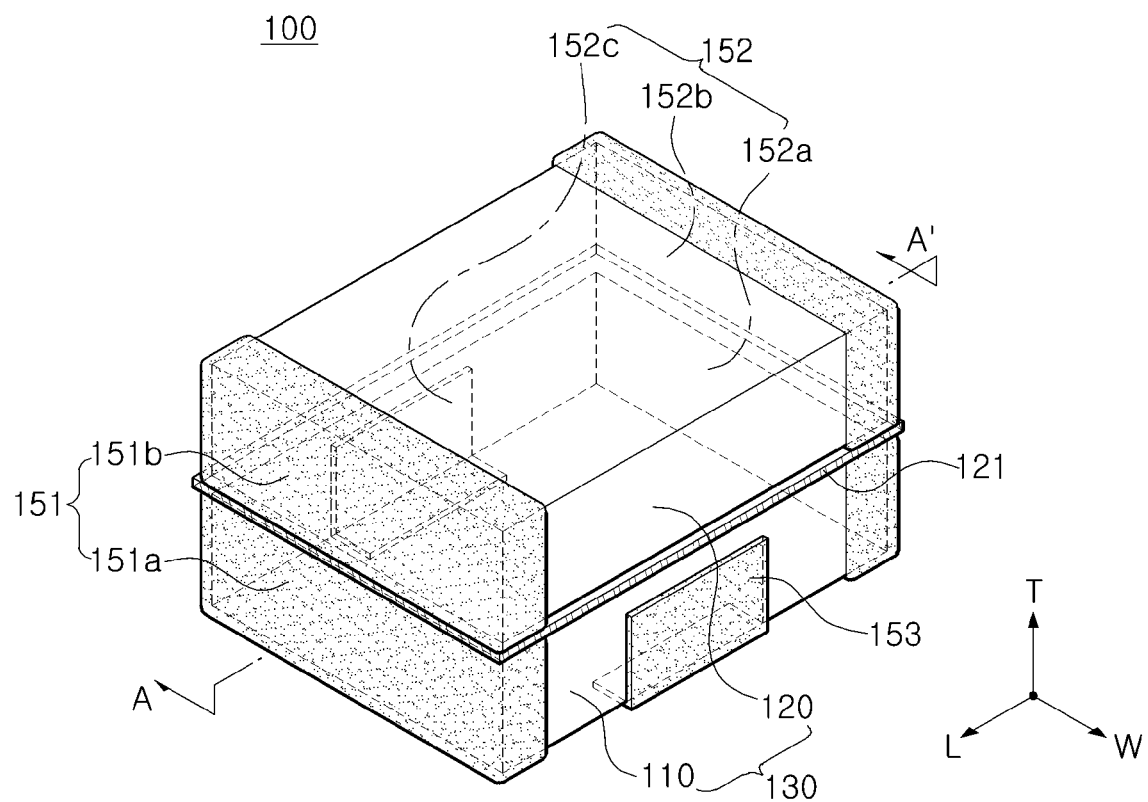
FIG. 1 is a perspective view schematically illustrating a composite electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

Hereinafter, exemplary embodiments in the present disclosure will be described with reference to the accompanying drawings.

FIG. 1 is a perspective view schematically illustrating a composite electronic component according to an exemplary embodiment in the present disclosure.

Figure 2:
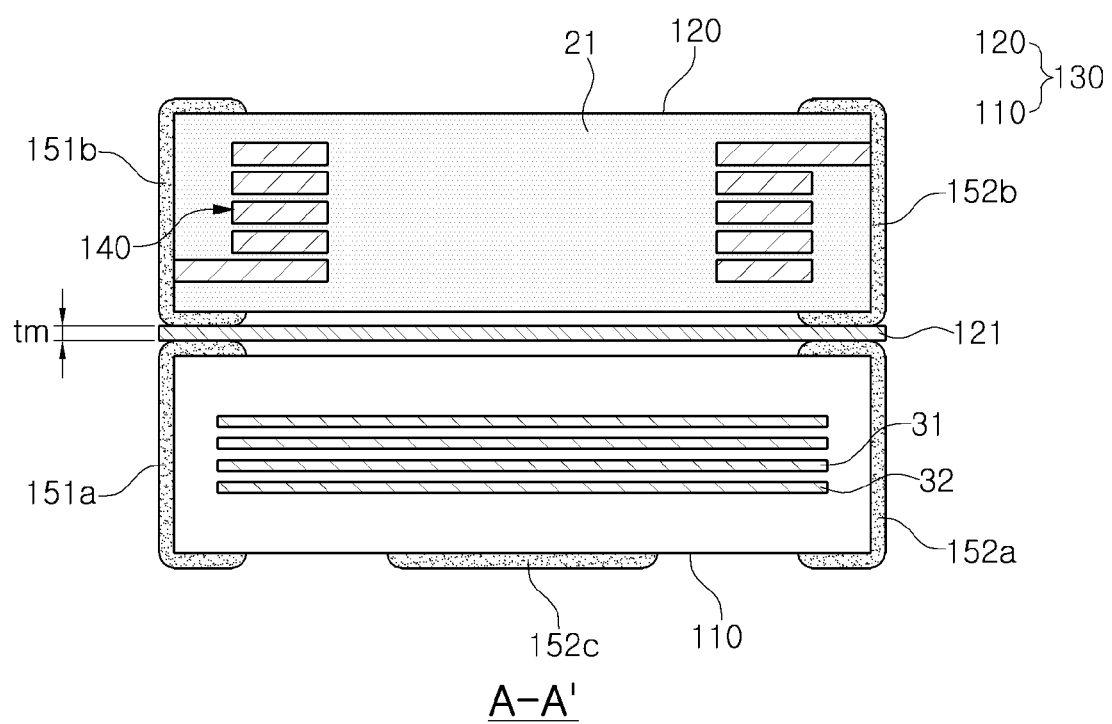
FIG. 2 is a cross-sectional view of a composite electronic component according to a first exemplary embodiment taken along line A-A' of FIG. 1.

FIG. 2 is a cross-sectional view of a composite electronic component according to a first exemplary embodiment taken along line A-A' of FIG. 1.

Figure 3:
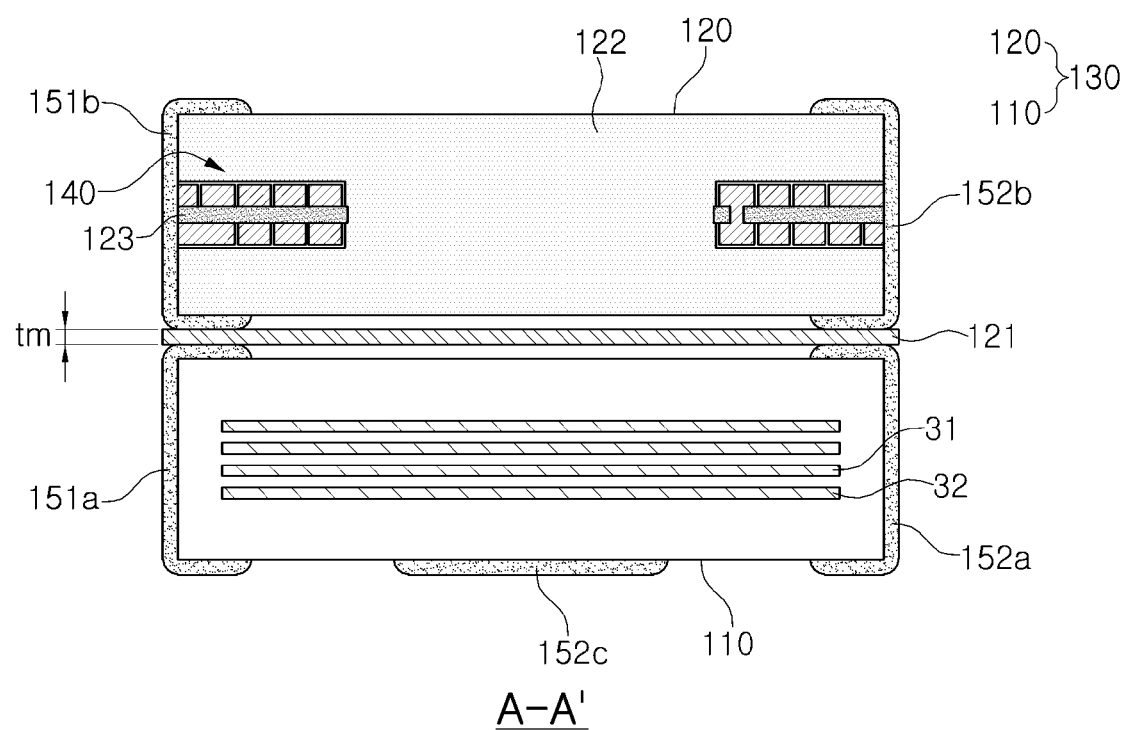
FIG. 3 is a cross-sectional view of a composite electronic component according to a second exemplary embodiment taken along line A-A' of FIG. 1.

FIG. 3 is a cross-sectional view of a composite electronic component according to a second exemplary embodiment taken along line A-A' of FIG. 1.

Figure 4:
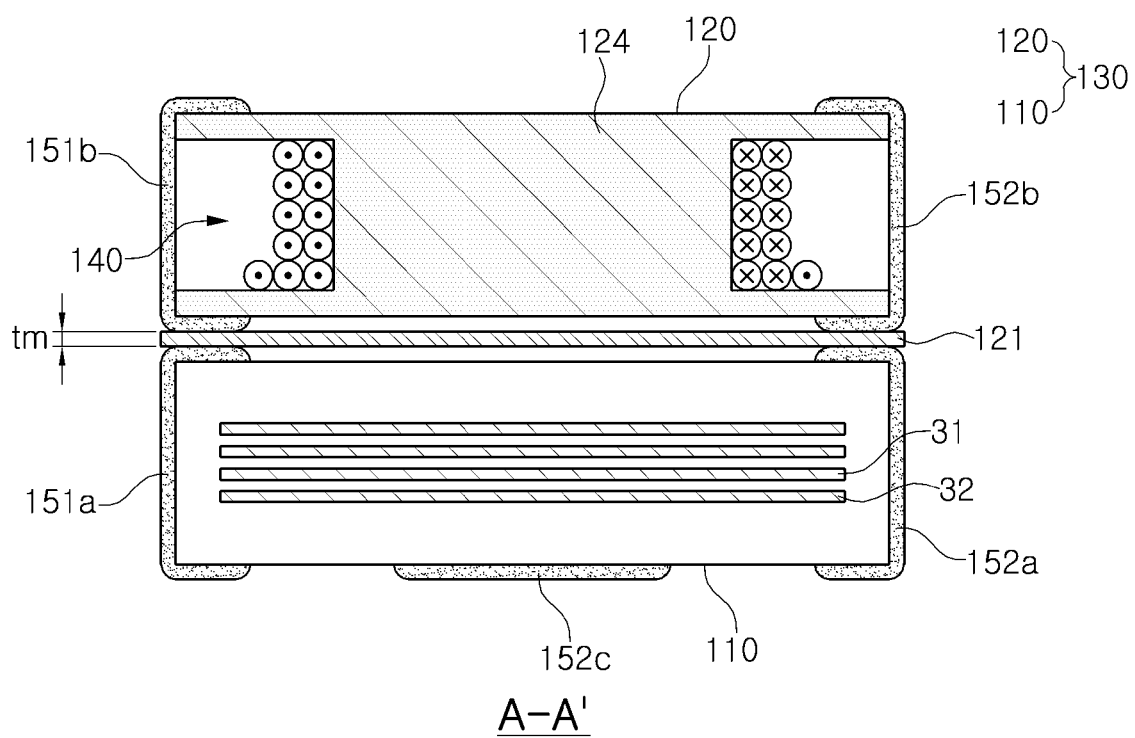
FIG. 4 is a cross-sectional view of a composite electronic component according to a third exemplary embodiment taken along line A-A' of FIG. 1.

FIG. 4 is a cross-sectional view of a composite electronic component according to a third exemplary embodiment taken along line A-A' of FIG. 1.

Figure 5:
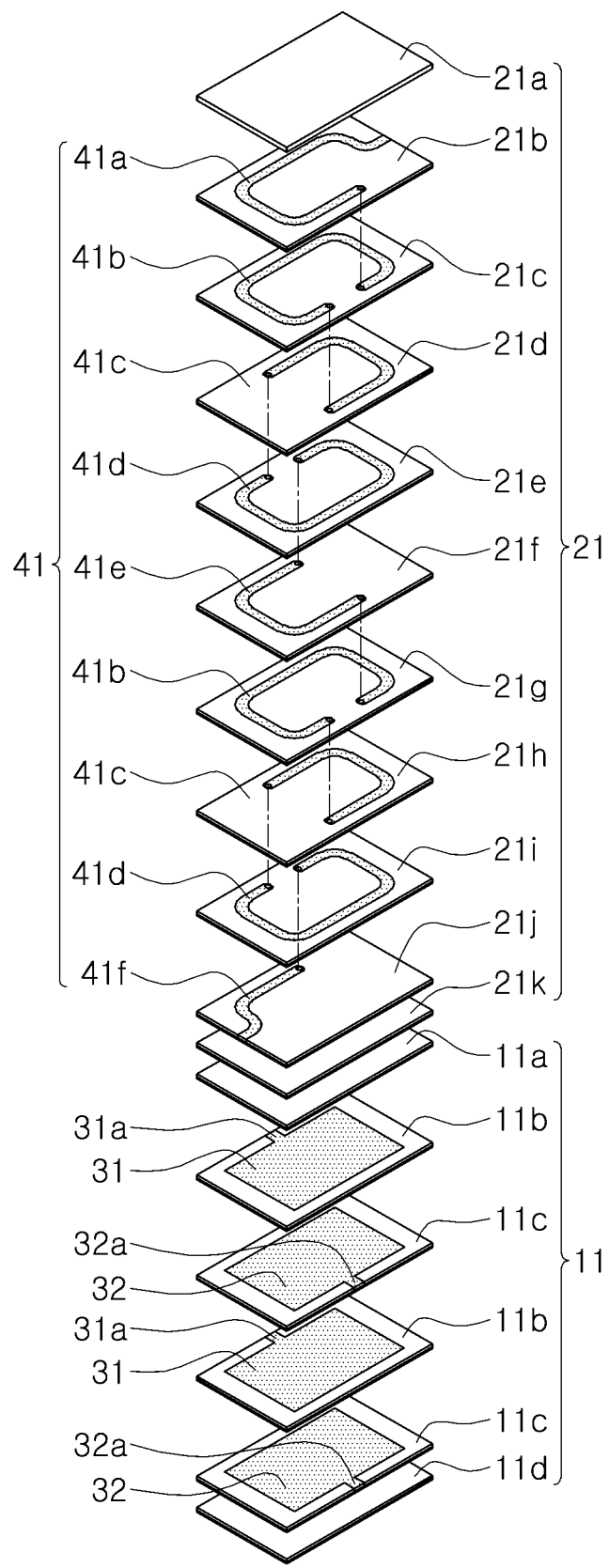
FIG. 5 is a schematic exploded perspective view illustrating a manner in which the composite electronic component according to the first exemplary embodiment illustrated in FIG. 1 is stacked.

FIG. 5 is a schematic exploded perspective view illustrating a manner in which the composite electronic component according to the first exemplary embodiment illustrated in FIG. 1 is stacked.

Figure 6:
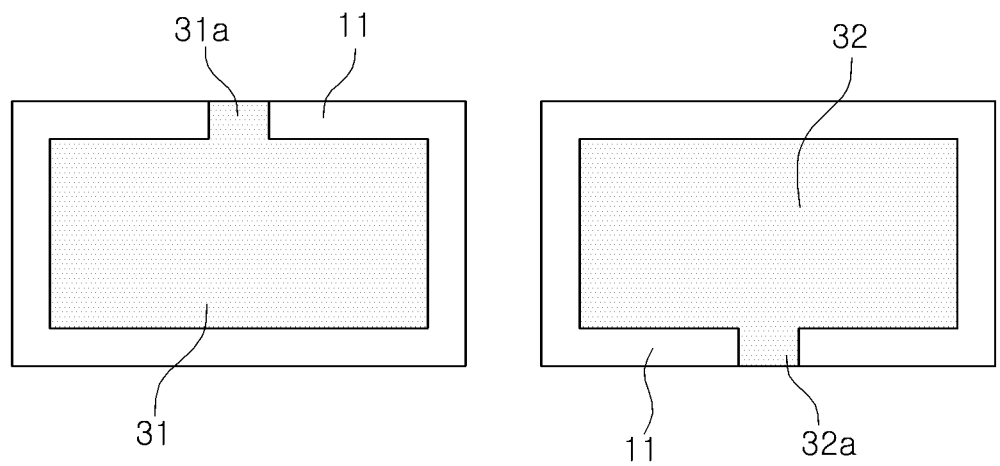
FIG. 6 is a plan view illustrating internal electrodes that may be used in a multilayer ceramic capacitor in the composite electronic component illustrated in FIG. 1.

FIG. 6 is a plan view illustrating internal electrodes that may be used in a multilayer ceramic capacitor in the composite electronic component illustrated in FIG. 1.

In the composite electronic component according to the exemplary embodiment in the present disclosure, a 'length direction' refers to an 'L' direction of FIG. 1, a 'width direction' refers to a 'W' direction of FIG. 1, and a 'thickness direction' refers to a 'T' direction of FIG. 1. Here, the 'thickness direction' refers to a direction in which dielectric layers of a capacitor are stacked, that is, a 'stacking direction'.

Meanwhile, the length direction, the width direction, and the thickness direction of the composite electronic component are the same as those of a capacitor and an inductor as described below.

In addition, in the exemplary embodiment in the present disclosure, the composite electronic component may have upper and lower surfaces opposing each other, and first and second end surfaces connecting the upper and lower surfaces to each other while being disposed in the length direction as well as first and second side surfaces connecting the upper and lower surfaces to each other while being disposed in the width direction. A shape of the composite electronic component is not particularly limited, but may be hexahedral, as illustrated.

In addition, the first and second end surfaces of the composite electronic component in the length direction and the first and second side surfaces thereof in the width direction may be the same as first and second end surfaces of a capacitor and an inductor in the length direction and first and second side surfaces thereof in the width direction, respectively, as described below.

Meanwhile, the composite electronic component may have a form in which the capacitor and the inductor are coupled to each other. In a case in which the inductor is coupled to the capacitor, an upper surface of the composite electronic component refers to an upper surface of the inductor and a lower surface thereof refers to a lower surface of the capacitor.

In addition, the upper and lower surfaces correspond to surfaces of the composite electronic component opposing each other in the thickness direction.

Referring to FIGS. 1 through 6, a composite electronic component 100 according to an exemplary embodiment in the present disclosure may include a composite body 130 in which a capacitor 110 and an inductor 120 are coupled to each other, wherein the capacitor 110 includes a ceramic body in which a plurality of dielectric layers 11 and first and second internal electrodes 31 and 32, disposed to face each other with respective dielectric layers 11 interposed therebetween, are stacked and the inductor 120 includes a magnetic body including a coil part 140.

The composite body 130 may be formed by coupling the capacitor 110 and the inductor 120 to each other. However, a method of forming the composite body 130 is not particularly limited.

The capacitor 110 and the inductor 120 may be coupled to each other by a conductive adhesive (not illustrated) disposed on one of an upper surface and a lower surface of a magnetic metal layer 121 to be described below.

For example, the composite body 130 may be formed by coupling the capacitor 110 and the inductor 120, having been separately manufactured, to each other using a conductive adhesive, a resin, or the like, or may be formed by sequentially stacking a ceramic body configuring the capacitor 110 and a magnetic body configuring the inductor 120.

Particularly, the adhesive or the resin used to couple the capacitor 110 and the inductor 120 to each other may be, for example, an epoxy resin, but is not limited thereto.

A method of coupling the capacitor 110 and the inductor 120 to each other using the conductive adhesive, the resin, or the like, is not particularly limited. For example, the capacitor 110 and the inductor 120 may be coupled to each other by applying the conductive adhesive, the resin, or the like, to a coupling surface of the capacitor 110 or the inductor 120 and heating and hardening the conductive adhesive, the resin, or the like.

Meanwhile, according to the exemplary embodiment in the present disclosure, the inductor 120 may be disposed above the capacitor 110, but is not limited thereto. That is, the inductor 120 may be disposed in various forms.

That is, the capacitor 110 may also be disposed above the inductor 120.

Hereinafter, the capacitor 110 and the inductor 120 configuring the composite body 130 will be described in detail.

According to the exemplary embodiment in the present disclosure, the magnetic body configuring the inductor 120 may include the coil part 140.

The inductor 120 is not particularly limited, but may be, for example, a multilayer type inductor, a thin film type inductor, or a winding type inductor.

The multilayer type inductor may be manufactured by printing relatively thick electrodes on thin ferrite or glass ceramic sheets, stacking several sheets on which coil patterns are printed, and connecting internal conducting wires to each other through via-holes.

The thin film type inductor may be manufactured by forming a conductive coil on a ceramic substrate by thin film sputtering or plating and filling the ceramic substrate with a ferrite material.

The winding type inductor may be manufactured by winding wires (conductive coil) around a core.

Referring to FIG. 2, in a composite electronic component according to a first exemplary embodiment in the present disclosure, the inductor 120 may be the multilayer type inductor.

In detail, the magnetic body may have a form in which a plurality of magnetic layers 21 having conductive patterns formed thereon are stacked. The conductive patterns may configure the coil part 140.

Referring to FIG. 3, in a composite electronic component according to a second exemplary embodiment in the present disclosure, the inductor 120 may be the thin film type inductor.

In detail, the inductor 120 may have a thin film form in which the magnetic body includes an insulating substrate 123 and coils disposed on at least one surface of the insulating substrate 123.

The magnetic body may be formed by filling upper and lower portions of the insulating substrate 123 having the coils disposed on at least one surface thereof with magnetic materials 122.

Referring to FIG. 4, in a composite electronic component according to a third exemplary embodiment in the present disclosure, the inductor 120 may be the winding type inductor.

In detail, in the inductor 120, the magnetic body may have a form in which it includes a core 124 and coils wound around the core 124.

The magnetic layer 21 and the magnetic material 122 may be formed of an Ni—Cu—Zn-based, an Ni—Cu—Zn—Mg-based, or an Mn—Zn-based ferrite material, but are not limited thereto.

According to the exemplary embodiment in the present disclosure, the inductor 120 may be a power inductor to which a large amount of current may be applied.

The power inductor may be a high efficiency inductor in which a change in inductance is smaller than that of a general inductor when a direct current (DC) current is applied thereto. That is, it may be considered that the power inductor includes DC bias characteristics (characteristics that inductance thereof changes depending on the DC current when the DC current is applied thereto) as well as a function of the general inductor.

That is, the composite electronic component according to the exemplary embodiment, used in a power management integrated circuit (PMIC), may include the power inductor, a high efficiency inductor of which a change in inductance is small when the DC current is applied thereto, rather than the general inductor.

Hereinafter, in the composite electronic components, a case in which the inductor 120 is the multilayer type inductor, the first exemplary embodiment in the present disclosure among the first to third exemplary embodiments in the present disclosure, will be described in more detail.

The magnetic body may be manufactured by printing conductive patterns 41 on a plurality of magnetic green sheets 21b to 21j, stacking the plurality of magnetic green sheets 21b to 21j having the conductive patterns 41 formed thereon, additionally stacking magnetic green sheets 21a and 21k on the magnetic green sheet 21b and beneath the magnetic green sheet 21j, respectively, and then sintering the magnetic green sheets 21a to 21k.

Referring to FIG. 5, the magnetic body may be formed by printing the conductive patterns 41 on the magnetic green sheets 21b to 21j, drying the conductive patterns 41, and then stacking the magnetic green sheets 21a and 21k on the magnetic green sheet 21b and beneath the magnetic green sheet 21j, respectively.

The conductive patterns 41 in the magnetic body may include a plurality of conductive patterns 41a to 41f stacked in the stacking direction to form coil patterns.

The conductive patterns 41 may be formed by printing a conductive paste containing silver (Ag) as a main component to a predetermined thickness.

The conductive patterns 41 may be electrically connected to input and output terminals 151 and 152 disposed on both end surfaces of the composite body in the length direction, respectively.

The conductive patterns 41 may include leads electrically connected to the input terminal 151 and the output terminal 152.

One conductive pattern 41a and another conductive pattern 41b of the conductive patterns 41 with the magnetic layer 21 interposed therebetween may be electrically connected to each other by a via electrode formed on the magnetic green sheet 21b and may form the coil pattern in the stacking direction.

In the exemplary embodiment in the present disclosure, the coil pattern is not particularly limited, but may be designed in accordance with inductance of the inductor.

That is, second to fifth conductive patterns 41b to 41e may be stacked in coil form between a first conductive pattern 41a having a lead exposed to the second end surface of the composite body in the length direction and a sixth conductive pattern 41f having a lead exposed to the first end surface of the composite body in the length direction, and the respective conductive patterns may be connected to each other by via electrodes formed in the respective magnetic green sheets, as described above.

Although a case in which the numbers of the second to fifth conductive patterns 41b to 41e are two has been illustrated in FIG. 5, the present disclosure is not limited thereto. That is, the numbers of the second to fifth conductive patterns 41b to 41e may not be limited depending on an object of the present disclosure.

Meanwhile, the ceramic body configuring the capacitor 110 may be formed by stacking the plurality of dielectric layers 11, and a plurality of internal electrodes 31 and 32 (first and second internal electrodes) may be disposed in the ceramic body to be spaced apart from each other with respective dielectric layers interposed therebetween.

The dielectric layer 11 may be formed by sintering a ceramic green sheet containing a ceramic powder, an organic solvent, and an organic binder. The ceramic powder, a high k material, may be a barium titanate (BaTiO$_3$)-based material, a strontium titanate (SrTiO$_3$)-based material, or the like, but is not limited thereto.

Meanwhile, according to the exemplary embodiment in the present disclosure, the internal electrodes may include first internal electrodes 31 having leads 31a exposed to the second side surface of the composite body 130 in the width direction and second internal electrodes 32 having leads 32a exposed to the first side surface of the composite body 130 in the width direction, but are not limited thereto.

According to the exemplary embodiment in the present disclosure, the first and second internal electrodes 31 and 32 may be formed of a conductive paste containing a conductive metal.

The conductive metal may be nickel (Ni), copper (Cu), palladium (Pd), or alloys thereof, but is not limited thereto.

The first and second internal electrodes 31 and 32 may be printed on the ceramic green sheets forming the dielectric layers 11, using conductive pastes by a printing method such as a screen printing method or a gravure printing method.

The ceramic green sheets having the internal electrodes printed thereon may be alternately stacked and sintered to form the ceramic body.

Although pattern shapes of the first and second internal electrodes 31 and 32 have been illustrated in FIG. 6, they are not limited to the shapes illustrated in FIG. 6, but may be variously modified.

The capacitor may serve to control a voltage supplied from a power management integrated circuit (PMIC).

The composite electronic component 100 according to the exemplary embodiment may include the input terminal 151 disposed on the first end surface of the composite body 130 in the length direction and connected to the coil part 140 of the inductor 120; the output terminal 152 including first output terminals 152a and 152b disposed on the second end surface of the composite body 130 in the length direction and connected to the coil part 140 of the inductor 120 and a second output terminal 152c disposed on the second side surface of the composite body 130 in the width direction and connected to the first internal electrodes 31 of the capacitor 110; and a ground terminal 153 disposed on the first side surface of the composite body 130 in the width direction and connected to the second internal electrodes 32 of the capacitor 110.

The input terminal 151 and the first output terminals 152a and 152b may be connected to the coil part 140 of the inductor 120 to serve as the inductor in the composite electronic component.

In addition, the second output terminal 152c may be connected to the first internal electrodes 31 of the capacitor 110 and the second internal electrodes 32 of the capacitor 110 may be connected to the ground terminal 153, such that they may serve as the capacitor in the composite electronic component.

The input terminal 151, the output terminal 152, and the ground terminal 153 may be formed of a conductive paste containing a conductive metal.

The conductive metal may be nickel (Ni), copper (Cu), tin (Sn), or alloys thereof, but is not limited thereto.

The conductive paste may further contain an insulating material. The insulating material may be, for example, glass, but is not limited thereto.

A method of forming the input terminal 151, the output terminal 152, and the ground terminal 153 is not particularly limited. That is, the input terminal 151, the output terminal 152, and the ground terminal 153 may be formed by dipping the ceramic body or be formed by another method such as a printing method, a plating method, or the like.

Meanwhile, the input terminal 151 and the first output terminals 152a and 152b may be disposed in a form of a single electrode, but are not limited thereto.

That is, according to another exemplary embodiment in the present disclosure, the input terminal 151 may be configured by coupling an external electrode 151b disposed on the first end surface of the magnetic body in the length direction and an external electrode 151a disposed on the first end surface of the ceramic body in the length direction to each other.

Likewise, the first output terminals 152a and 152b may be configured by coupling an external electrode 152b disposed on the second end surface of the magnetic body in the length direction and an external electrode 152a disposed on the second end surface of the ceramic body in the length direction to each other.

Figure 7:
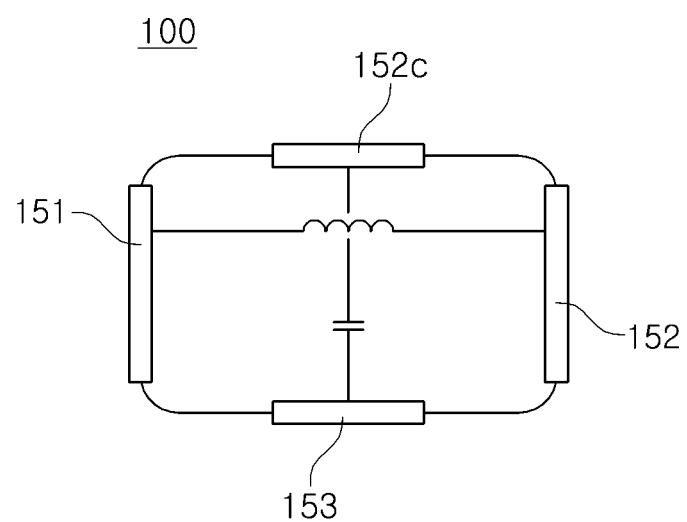
FIG. 7 is an equivalent circuit diagram of the composite electronic component illustrated in FIG. 1.

FIG. 7 is an equivalent circuit diagram of the composite electronic component illustrated in FIG. 1.

Referring to FIG. 7, the composite electronic component according to the exemplary embodiment may include the inductor 120 and the capacitor 110 coupled to each other unlike a composite electronic component according to the related art. Therefore, the inductor 120 and the capacitor 110 may be designed to have the shortest distance therebetween, whereby noise may be decreased.

In addition, the inductor 120 and the capacitor 110 are coupled to each other, such that amounting area thereof in the PMIC is significantly decreased, whereby mounting space may be easily secured.

In addition, costs required for mounting the composite electronic component may be decreased.

Meanwhile, as electronic apparatuses are increased in terms of functionality, the number of DC to DC converters included in the PMIC may increase. In addition, the number of passive devices required to be included in a power input terminal and a power output terminal of the PMIC has also increased.

In this case, an area in which components are disposed in the electronic apparatuses may be inevitably increased, which may limit miniaturization of the electronic apparatuses.

In addition, a large amount of noise may be generated due to the PMIC and wiring patterns of peripheral circuits of the PMIC.

In order to solve the above-mentioned problems, research into a composite electronic component in which an inductor and a capacitor are coupled to each other in a vertical direction has been conducted, such that effects such as a decrease in an area in which the components are disposed in the electronic apparatus and suppression of noise generation have been obtained.

However, in a case in which the inductor and the capacitor are disposed in the vertical direction as described above, external terminals of the inductor have an influence on internal electrodes of the capacitor to generate parasitic capacitance, such that a problem in which a self resonant frequency (SRF) moves toward a low frequency may occur.

In a case in which the SRF moves toward a low frequency, as described above, a frequency region of the inductor that may be used in the exemplary embodiment in the present disclosure may be narrowed.

That is, since a function of the inductor does not appear in a high frequency region of the SRF or more, in the case in which the SRF moves toward the low frequency, there is a problem that a usable frequency region is limited.

However, according to the exemplary embodiment in the present disclosure, the magnetic metal layer 121 may be provided between the inductor 120 and the capacitor 110 to significantly decrease an influence of a magnetic flux generated in the inductor on the internal electrodes of the capacitor, thereby preventing a change in the SRF.

That is, according to the exemplary embodiment in the present disclosure, the inductor 120 and the capacitor 110 may be designed to have the shortest distance therebetween. Therefore, noise may be decreased, and the change in the SRF may be prevented, such that a range of the inductor that may be used at the low frequency may not be limited.

Meanwhile, in accordance with miniaturization of the composite electronic component, an internal magnetic layer blocking a magnetic field of the inductor is also thinned, such that a quality (Q) factor is deteriorated.

The Q factor means loss of a device or a decrease in efficiency of the device. A high Q value means that loss is low and efficiency is high.

According to the exemplary embodiment in the present disclosure, the magnetic metal layer 121 may be provided between the inductor 120 and the capacitor 110 to signifi-
cantly decrease an influence of respective components on each other, thereby preventing deterioration of the Q factor of the components.

A more detailed description for the SRF and the Q factor will be provided below.

According to the exemplary embodiment in the present disclosure, as described above, the capacitor 110 and the inductor 120 may be coupled to each other in the vertical direction, and the magnetic metal layer 121 may be provided between the inductor 120 and the capacitor 110.

When a thickness of the magnetic metal layer 121 is tm, the thickness tm of the magnetic metal layer 121 may be 50 to 300 μm, but is not limited thereto.

As described above, since the thickness tm of the magnetic metal layer 121 provided between the inductor 120 and the capacitor 110 satisfies a range of 50 to 300 μm, an influence of the external electrodes of the inductor on the internal electrodes of the capacitor may be significantly decreased to prevent a change in the SRF.

In addition, an influence of the respective components on each other may be significantly decreased to prevent deterioration of the Q factor of the components.

In a case in which the thickness tm of the magnetic metal layer 121 provided between the inductor 120 and the capacitor 110 is less than 50 μm, the influence of the external electrodes of the inductor on the internal electrodes of the capacitor may not be significantly decreased, such that the SRF moves toward the low frequency. Therefore, a usable range of the inductor may be narrowed.

In addition, the magnetic flux generated in the inductor may have an influence on the capacitor, such that the Q factor may be deteriorated.

Meanwhile, in a case in which the thickness tm of the magnetic metal layer 121 provided between the inductor 120 and the capacitor 110 exceeds 300 μm, a ratio occupied by the magnetic metal layer in a thickness of a standardized composite electronic component may become excessively high, such that an target inductance of the inductor and a target capacitance of the capacitor may not be obtained.

The magnetic metal layer 121 may contain one or more of a metal powder, a metal flake, and ferrite, but is not limited thereto.

Particularly, when a material having magnetic permeability higher than that of a material of the magnetic body except for the coil part 140 of the inductor 120 is used as a material of the magnetic metal layer, a more excellent effect may be obtained.

Therefore, the magnetic metal layer 121 may contain one or more of the metal powder and the metal flake.

The metal powder and the metal flake may contain one or more selected from the group consisting of iron (Fe), an iron-silicon (Fe—Si) alloy, an iron-silicon-aluminum (Fe—Si—Al) alloy, an iron-silicon-chromium (Fe—Si—Cr) alloy, and a nickel-iron-molybdenum (Ni—Fe—Mo) alloy, but are not limited thereto.

Particularly, in a case in which the magnetic metal layer 121 contains the metal flake, loss may be decreased due to a decrease in a demagnetizing factor depending on a squareness ratio (Mr/Ms), a ratio between maximum magnetization and residual magnetization, thereby improving magnetic permeability of the inductor 120.

Figure 8:
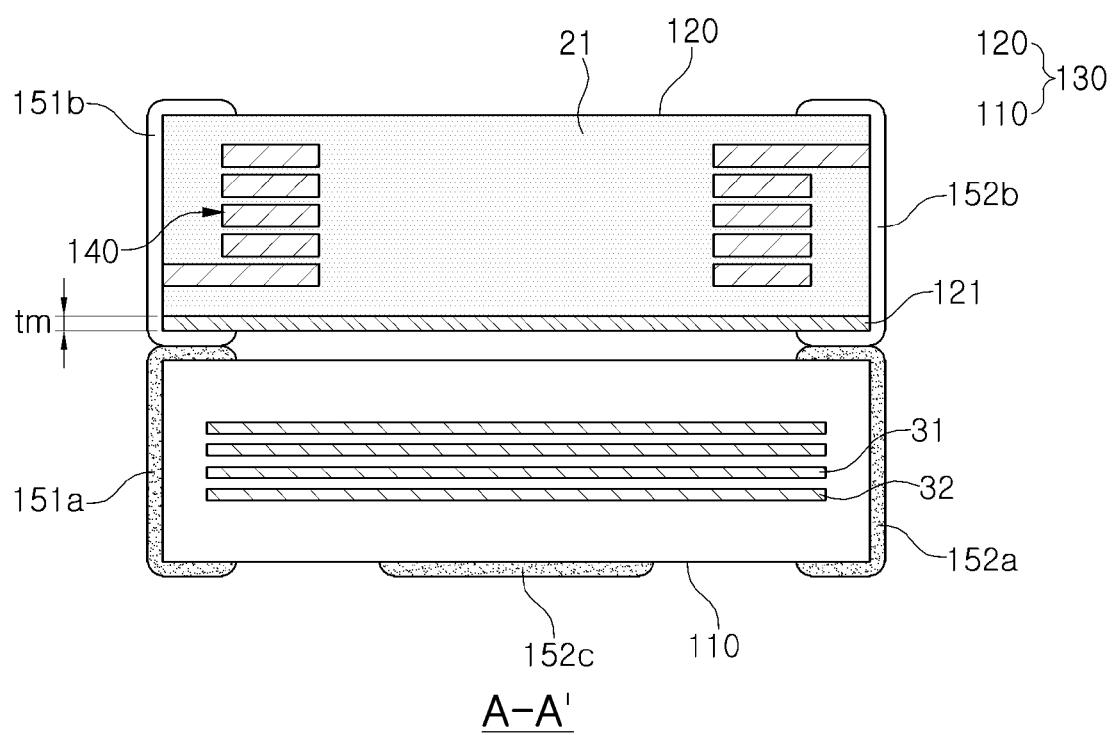
FIG. 8 is a cross-sectional view of the composite electronic component according to another exemplary embodiment in the present disclosure taken along line A-A' of FIG. 1.

FIG. 8 is a cross-sectional view of the composite electronic component according to another exemplary embodiment in the present disclosure taken along line A-A' of FIG. 1.

Figure 9:
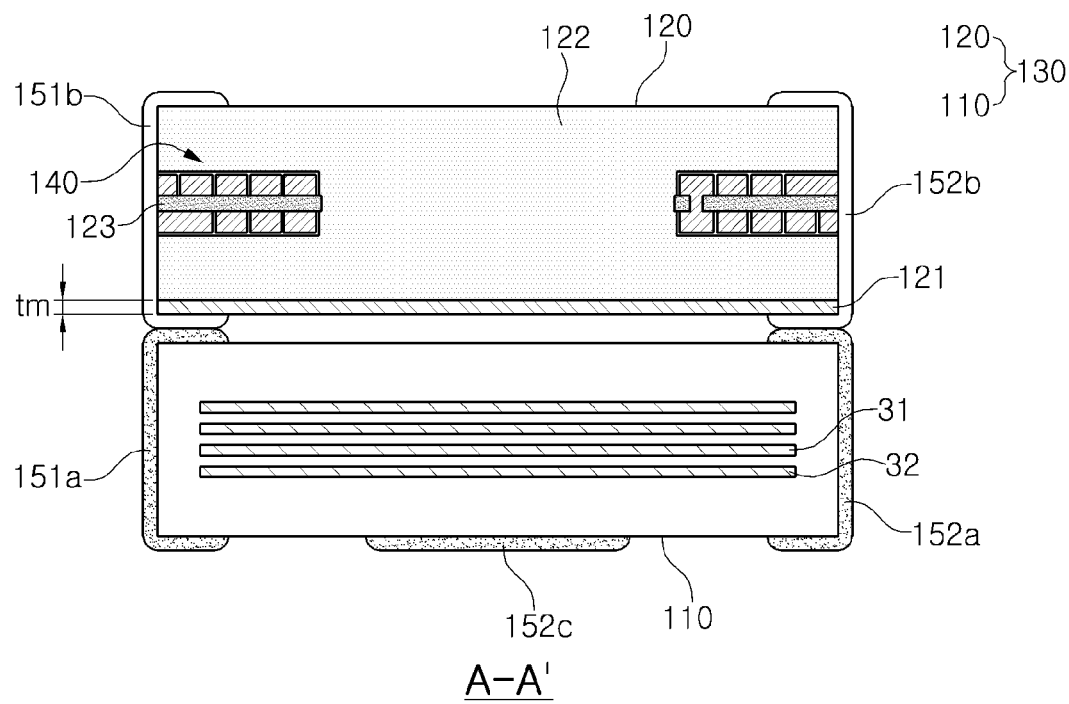
FIG. 9 is a cross-sectional view of the composite electronic component according to another exemplary embodiment in the present disclosure taken along line A-A' of FIG. 1.

FIG. 9 is a cross-sectional view of the composite electronic component according to another exemplary embodiment in the present disclosure taken along line A-A' of FIG. 1.

Referring to FIGS. 8 and 9, the composite electronic component according to another exemplary embodiment in the present disclosure may include a composite body 130 in which a capacitor 110 and an inductor 120 are coupled to each other, the capacitor 110 including a ceramic body in which a plurality of dielectric layers 11 and first and second internal electrodes 31 and 32 are disposed to face each other with respective dielectric layers 11 interposed therebetween are stacked and the inductor 120 including a magnetic body including a coil part 140; an input terminal 151 disposed on a first end surface of the composite body 130 in a length direction and connected to the coil part 140 of the inductor 120; an output terminal 152 including first output terminals 152a and 152b disposed on a second end surface of the composite body 130 in the length direction and connected to the coil part 140 of the inductor 120 and a second output terminal 152c disposed on a second side surface of the composite body 130 in a width direction and connected to the first internal electrodes 31 of the capacitor 110; and a ground terminal 153 disposed on a first side surface of the composite body 130 in the width direction and connected to the second internal electrodes 32 of the capacitor 110, wherein the capacitor 110 and the inductor 120 are coupled to each other in the vertical direction, the inductor 120 includes the coil part 140 and cover layers disposed on upper and lower surfaces of the coil part 140, respectively, and a magnetic metal layer 121 is disposed on the uppermost portion of the cover layer adjacent to the capacitor 110.

The magnetic body may have a form in which a plurality of magnetic layers having conductive patterns disposed thereon are stacked. The conductive patterns may configure the coil part 140.

The inductor 120 may have a thin film form in which the magnetic body includes an insulating substrate 123 and coils disposed on at least one surface of the insulating substrate 123.

The capacitor and the inductor may be coupled to each other by a conductive adhesive.

Referring to FIGS. 8 and 9, the magnetic metal layer 121 may be disposed on the uppermost portion of the cover layer of the inductor 120 adjacent to the capacitor 110 to significantly decrease an influence of external electrodes of the inductor on the internal electrodes of the capacitor, thereby preventing a change in an SRF.

In addition, an influence of respective components on each other may be significantly decreased to prevent deterioration of a Q factor of the components.

Since features other than the above-mentioned features are the same as those of the composite electronic component according to the exemplary embodiment in the present disclosure, a description therefor will be omitted in order to avoid overlapped descriptions.

According to another exemplary embodiment in the present disclosure, a composite electronic component used in a power supply terminal of a portable mobile apparatus, suppressing an alternating current (AC) component of received power, and decreasing ripple may include a power stabilizing unit including a composite body in which a capacitor and an inductor are coupled to each other and having a magnetic metal layer provided between the inductor and the capacitor, the capacitor including a ceramic body in which a plurality of dielectric layers and first and second internal electrodes, having respective dielectric layers interposed therebetween and facing each other, are stacked and the inductor including a magnetic body including a coil part; an input terminal disposed on a first end surface of the power stabilizing unit in a length direction and receiving power converted by a power managing unit; an output terminal including first and second output terminals disposed on a second end surface of the power stabilizing unit in the length direction and a second side surface thereof in a width direction and supplying the power stabilized by the power stabilizing unit; and a ground terminal disposed on a first side surface of the power stabilizing unit in the width direction and connected to the second internal electrodes of the capacitor, wherein the inductor suppresses the AC component of the received power and the capacitor decreases ripple in the received power.

A more detailed description will be provided below with reference to the accompanying drawings.

Figure 10:
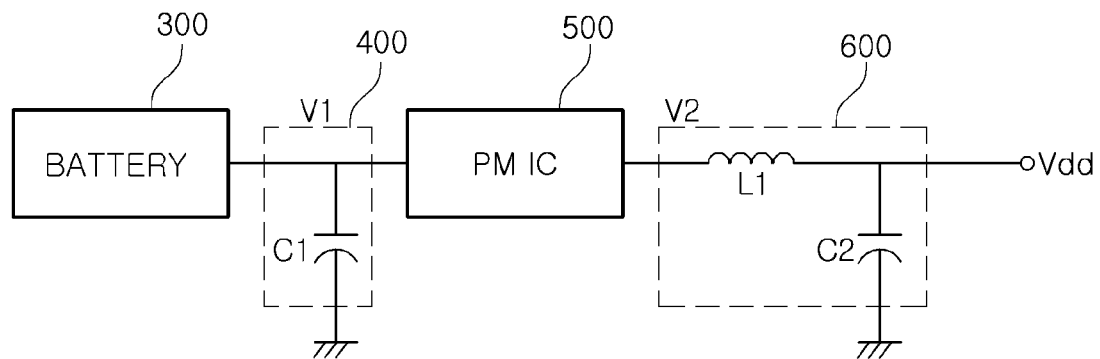
FIG. 10 is a view illustrating a driving power supply system supplying driving power to a predetermined terminal requiring the driving power through a battery and a power managing unit.

FIG. 10 is a view illustrating a driving power supply system supplying driving power to a predetermined terminal requiring the driving power through a battery and a power managing unit.

Referring to FIG. 10, the driving power supply system may include a battery 300, a first power stabilizing unit 400, a power managing unit 500, and a second power stabilizing unit 600.

The battery 300 may supply power to the power managing unit 500. Here, the power supplied to the power managing unit 500 by the battery 300 will be defined as first power.

The first power stabilizing unit 400 may stabilize the first power V1 and supply the stabilized first power to the power managing unit. In detail, the first power stabilizing unit 400 may include a capacitor C1 disposed between a connection terminal between the battery 300 and the power managing unit 500 and a ground. The capacitor C1 may decrease noise included in the first power.

In addition, the capacitor C1 may be charged with electric charges. In addition, in a case in which the power managing unit 500 instantaneously consumes a large amount of current, the capacitor C1 may discharge the electric charges charged therein, thereby suppressing a voltage variation in the power managing unit 500.

The capacitor C1 may be a high capacitance capacitor in which the number of stacked dielectric layers is 300 or more.

The power managing unit 500 may serve to convert power input to an electronic apparatus into power appropriate for the electronic apparatus and distribute, charge, and control the power. Therefore, the power managing unit 500 may generally include a DC to DC converter.

In addition, the power managing unit 500 may be implemented by a power management integrated circuit (PMIC).

The power managing unit 500 may convert the first power V1 into second power V2. The second power V2 may be required by an active device such as an integrated circuit (IC), or the like, connected to an output terminal of the power managing unit 500 to receive driving power from the power managing unit 500.

The second power stabilizing unit 600 may stabilize the second power V2 and transfer the stabilized second power to an output terminal Vdd. An active device such as an integrated circuit (IC), or the like, receiving the driving power from the power managing unit 500 may be connected to the output terminal Vdd.

In detail, the second power stabilizing unit 600 may include an inductor L1 connected to the power managing unit 500 in series and the output terminal Vdd between the power managing unit 500 and the output terminal Vdd. In addition, the second power stabilizing unit 600 may include a capacitor C2 disposed between a connection terminal between the power managing unit 500 and the output terminal Vdd and a ground.

The second power stabilizing unit 600 may decrease noise included in the second power V2.

In addition, the second power stabilizing unit 600 may stably supply the power to the output terminal Vdd.

The inductor L1 may be a power inductor that may be applied to a large amount of current.

The power inductor may be a high efficiency inductor in which a change in inductance is smaller than that of a general inductor when a DC current is applied thereto. That is, it may be considered that the power inductor includes DC bias characteristics (characteristics that inductance thereof changes depending on the DC current when the DC current is applied thereto) as well as a function of the general inductor.

In addition, the capacitor C2 may be a high capacitance capacitor.

Figure 11:
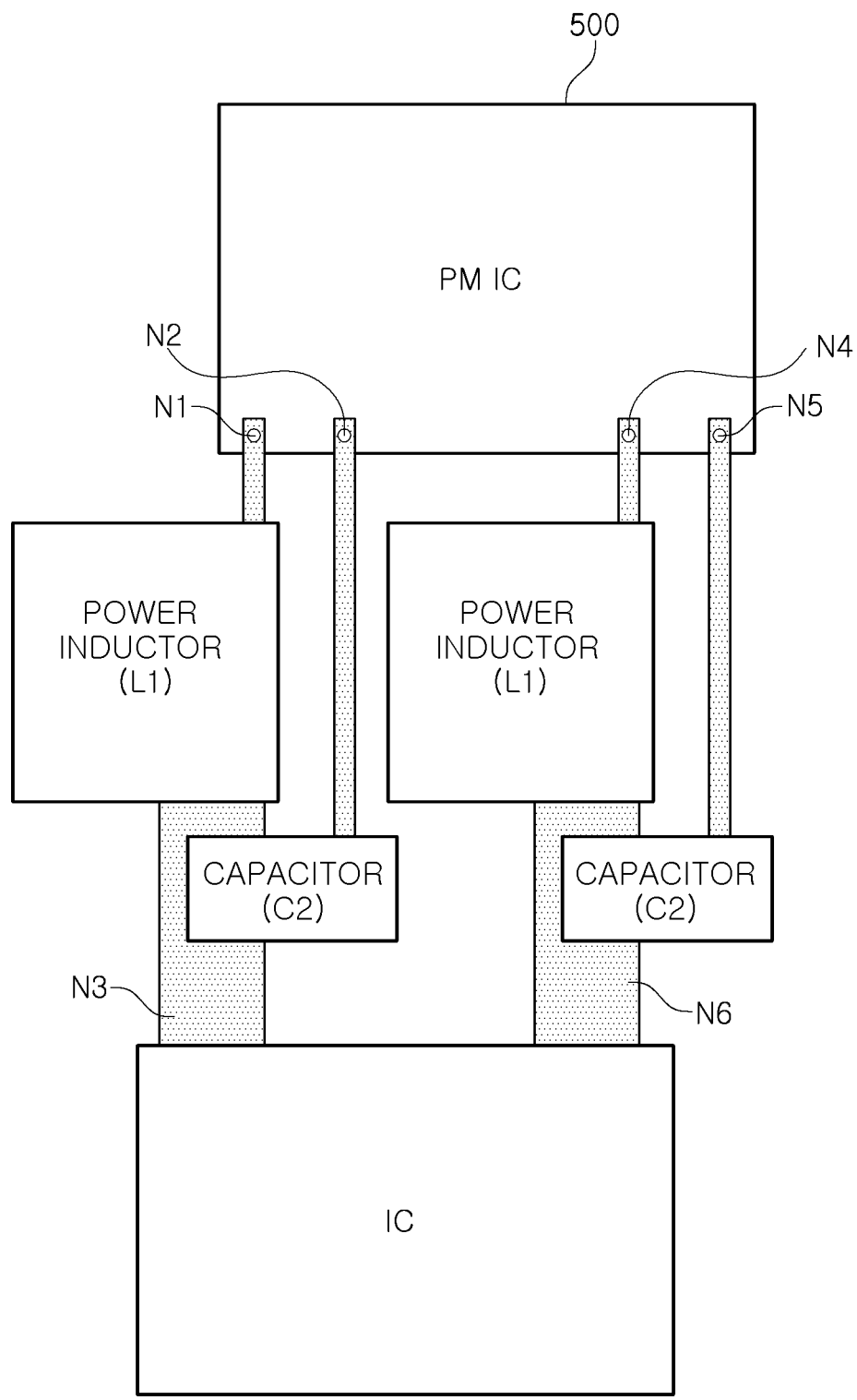
FIG. 11 is a view illustrating a pattern in which the driving power supply system is disposed.

FIG. 11 is a view illustrating a pattern in which the driving power supply system is disposed.

Referring to FIG. 11, a layout pattern in which the power managing unit 500, the power inductor L1, and the second capacitor C2 are disposed may be provided.

Generally, the power managing unit PMIC 500 may include several to several tens of DC to DC converters. In addition, in order to implement a function of the DC to DC converters, a power inductor and a high capacitance capacitor may be required in each of the DC to DC converters.

Referring to FIG. 11, the power managing unit 500 may have predetermined terminals N1 and N2. The power managing unit 500 may receive power from the battery and convert the power using the DC to DC converters. In addition, the power managing unit 500 may supply the converted power through the first terminal N1. The second terminal N2 may be a ground terminal.

Here, the first power inductor L1 and the second capacitor C2 may receive power from the first terminal N1, stabilize the power, and supply driving power through a third terminal N3. Therefore, the first power inductor L1 and the second capacitor C2 may serve as the second power stabilizing unit.

Since fourth to sixth terminals N4 to N6 illustrated in FIG. 11 perform the same functions as those of the first to third terminals N1 to N3, a detailed description thereof will be omitted.

In designing a pattern of the driving power supply system, disposing the power managing unit, the power inductor, and the high capacitance capacitor as closely to each other as possible is an important consideration. In addition, it may be necessary to design a wiring of a power line to be short and thick.

The reason may be that the requirements as described above need to be satisfied in order to decrease an area of a component and suppress the generation of noise.

In a case in which the number of output terminals of the power managing unit 500 is small, a problem in disposing the power inductor and the high capacitance capacitor closely to each other may not occur. However, in a case in which several output terminals of the power managing unit 500 need to be used, the power inductor and the high capacitance capacitor may not be able to be normally disposed due to mounting density of the components. In addition, a situation in which the power inductor and the high capacitance capacitor should be disposed in a non-optimal state, depending on a priority of power, may occur.

For example, since sizes of the power inductor and the high capacitance capacitor are large, a situation in which a power line and a signal line are inevitably elongated at the time of actually disposing the power inductor and the high capacitance capacitor may occur.

In a case in which the power inductor and the high capacitance capacitor are disposed in the non-optimal state, an interval between the power inductor and the high capacitance capacitor and the power line may be elongated, such that noise may be generated. The noise may have a negative influence on the driving power supply system.

Figure 12:
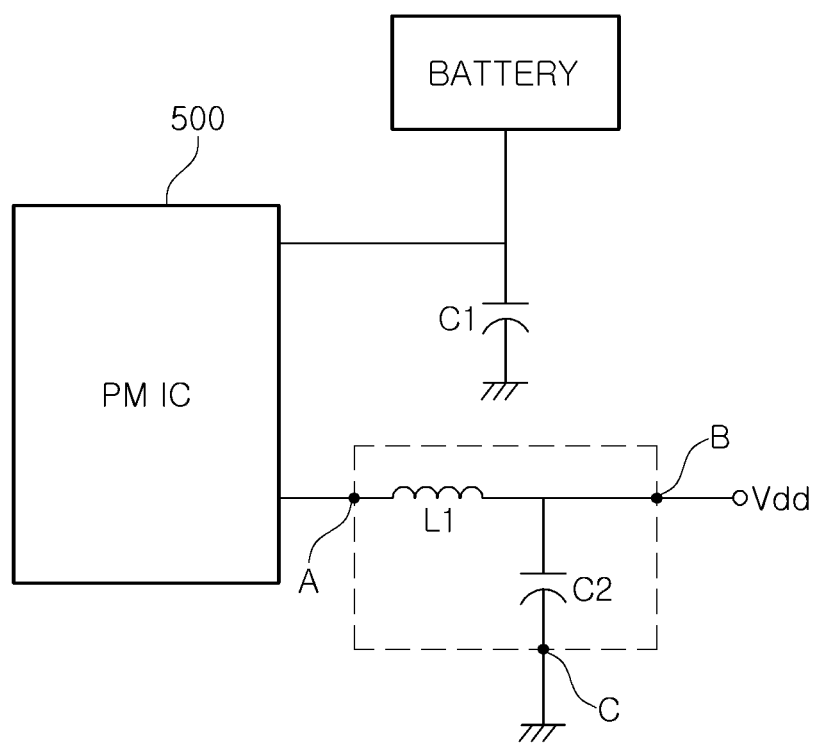
FIG. 12 is a circuit diagram of the composite electronic component according to the exemplary embodiment in the present disclosure.

FIG. 12 is a circuit diagram of the composite electronic component according to the exemplary embodiment in the present disclosure.

Referring to FIG. 12, the composite electronic component may include an input terminal part A (input terminal), a power stabilizing unit, an output terminal part B (output terminal), and a ground terminal part C (ground terminal).

The power stabilizing unit may include a power inductor L1 and a second capacitor C2.

The composite electronic component 700 may serve as the second power stabilizing unit described above.

The input terminal part A may receive power converted by the power managing unit 500.

The power stabilizing unit may stabilize the power supplied from the input terminal part A.

The output terminal part B may supply the stabilized power to an output terminal Vdd.

The ground terminal part C may connect the power stabilizing unit to a ground.

Meanwhile, the power stabilizing unit may include the power inductor L1 connected between the input terminal part A and the output terminal part B and the second capacitor C2 connected between the ground terminal part C and the output terminal part.

Referring to FIG. 12, the power inductor L1 and the second capacitor C2 may have a common output terminal part B, whereby an interval between the power inductor L1 and the second capacitor C2 may be decreased.

As described above, the composite electronic component may be formed by implementing the power inductor and the high capacitance capacitor provided in an output power terminal of the power managing unit 500 as a single component. Therefore, in the composite electronic component, a degree of integration of devices may be improved.

Figure 13:
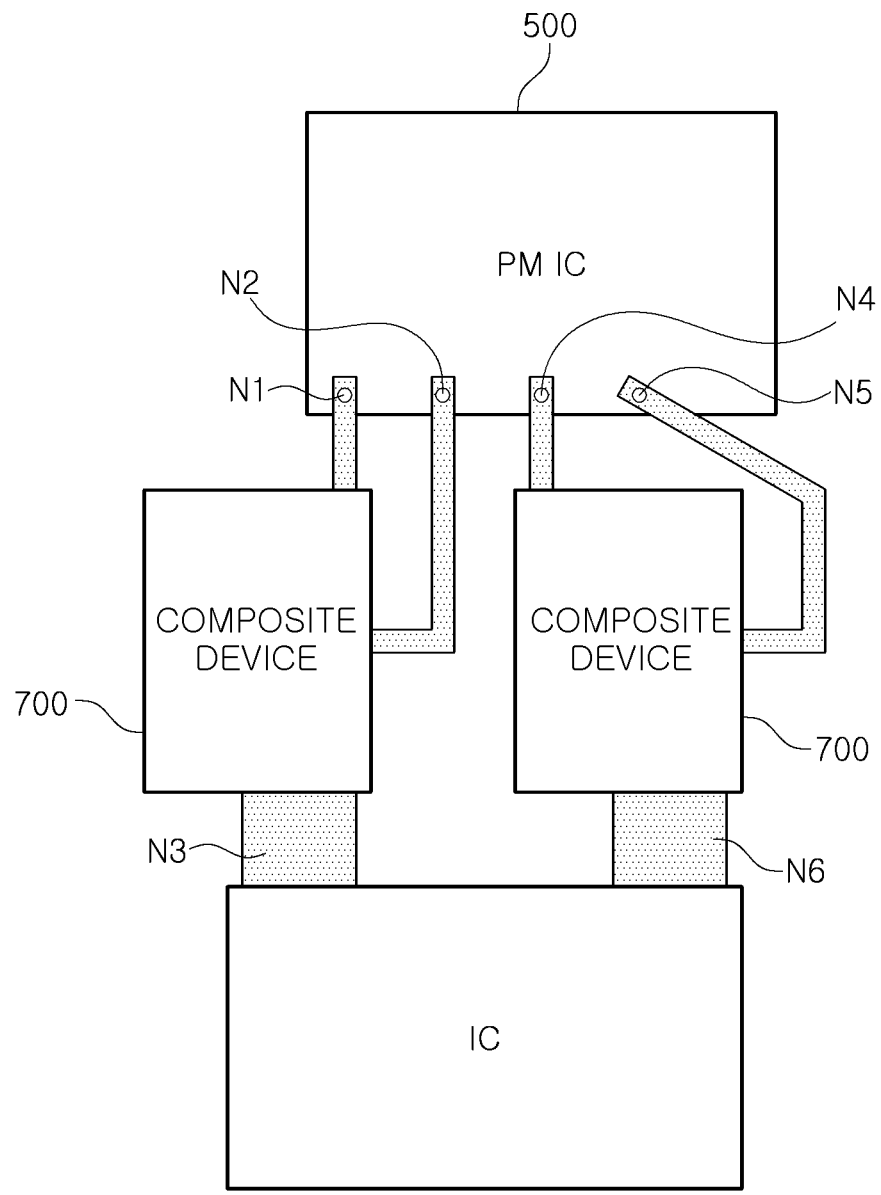
FIG. 13 is a view illustrating a pattern in which the driving power supply system using the composite electronic component according to the exemplary embodiment in the present disclosure is disposed.

FIG. 13 is a view illustrating a pattern in which the driving power supply system using the composite electronic component according to the exemplary embodiment in the present disclosure is disposed.

Referring to FIG. 13, it may be confirmed that the second capacitor C2 and the power inductor L1 illustrated in FIG. 11 have been replaced by the composite electronic component according to the exemplary embodiment in the present disclosure.

As described above, the composite electronic component may serve as the second power stabilizing unit.

In addition, the second capacitor C2 and the power inductor L1 are replaced by the composite electronic component according to the exemplary embodiment in the present disclosure, whereby a length of a wiring may be significantly decreased. In addition, the number of devices disposed in the driving power supply system is decreased, whereby the devices may be optimally disposed.

That is, according to the exemplary embodiment in the present disclosure, the power managing unit, the power inductor, and the high capacitance capacitor may be disposed as closely to each other as possible, and the wiring of the power line may be designed to be short and thick to decrease noise.

Meanwhile, electronic apparatus manufacturers have made an effort to decrease a size of a printed circuit board (PCB) included in an electronic apparatus in order to satisfy consumer demand. In this regard, increasing a degree of integration of ICs mounted on the PCB has been demanded. As in the composite electronic component according to the exemplary embodiment in the present disclosure, a plurality of devices are implemented as a single composite component, whereby this demand may be satisfied.

Further, according to the exemplary embodiment in the present disclosure, two components (the second capacitor and the power inductor) are implemented as a single composite electronic component, whereby an area in which they are mounted on the PCB may be decreased. According to the present exemplary embodiment, an area in which the components are mounted may be decreased by about 10 to 30% as compared with an existing disposition pattern.

Further, according to the exemplary embodiment in the present disclosure, the power managing unit 500 may supply the driving power to the IC receiving the driving power by the smallest wiring.

Further, in the composite electronic component according to the exemplary embodiment, the magnetic metal layer may be provided between the inductor and the capacitor or may be disposed on the uppermost portion of the cover layer of the inductor adjacent to the capacitor to significantly decrease an influence of the external electrodes of the inductor on the internal electrodes of the capacitor, thereby preventing a change in the SRF.

In addition, in the composite electronic component according to the exemplary embodiment, the magnetic metal layer may be provided between the inductor and the capacitor or be disposed on the uppermost portion of the cover layer of the inductor adjacent to the capacitor to prevent the deterioration of the Q factor of the component.

Board Having Composite Electronic Component

Figure 14:
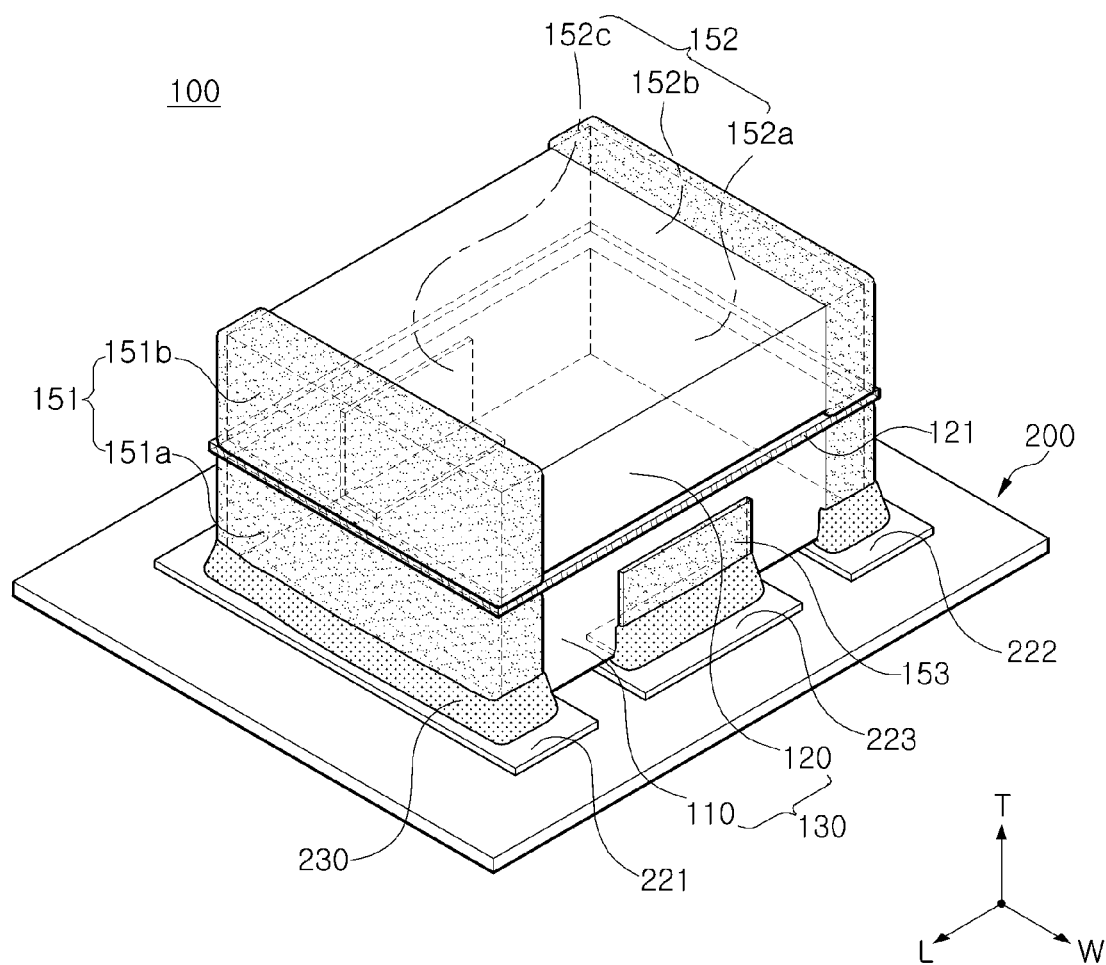
FIG. 14 is a perspective view illustrating a manner in which the composite electronic component of FIG. 1 is mounted on a printed circuit board.

FIG. 14 is a perspective view illustrating a manner in which the composite electronic component of FIG. 1 is mounted on a printed circuit board.

Referring to FIG. 14, a board 200 having a composite electronic component 100 according to the exemplary embodiment in the present disclosure may include a printed circuit board 210 on which the composite electronic component 100 is mounted and three or more electrode pads 221 to 223 disposed on an upper surface of the printed circuit board 210.

The electrode pads may be first to third electrode pads 221 to 223 connected to the input terminal 151, the output terminal 152, and the ground terminal 153 of the composite electronic component, respectively.

Here, the input terminal 151, the output terminal 152, and the ground terminal 153 of the composite electronic component 100 may be electrically connected to the printed circuit board 210 by solders 230 in a state in which they are positioned on the first to third electrode pads 221 to 223, respectively, to contact the first to third electrode pads 221 to 223, respectively.

In addition, the composite electronic component mounted on the printed circuit board may be the composite electronic component according to another exemplary embodiment in the present disclosure, and a description therefor will be omitted in order to avoid an overlapped description.

The following Table 1 illustrates a change in a Q factor depending on a thickness of a magnetic metal layer provided between an inductor and a capacitor in a composite electronic component in which the inductor and the capacitor are coupled to each other in the vertical direction and a frequency.

TABLE 1

| Thickness (μm) of Magnetic metal Layer | Frequency | | | |
| --- | --- | --- | --- | --- |
|  | 1 MHz | 3 MHz | 6 MHz | 9 MHz |
| 0 | 25.1 | 22.6 | 16.9 | 16.7 |
| 50 | 26.6 | 23.2 | 17.2 | 16.8 |
| 100 | 31.3 | 24.6 | 18.4 | 17.0 |
| 200 | 36.4 | 27.3 | 19.0 | 17.1 |
| 300 | 36.5 | 27.4 | 19.0 | 17.1 |

Referring to Table 1, it may be appreciated that a Q factor is more excellent in a case in which a thickness of the magnetic metal layer provided between the inductor and the capacitor is 50 to 300 μm than in a case in which the magnetic metal layer is not provided between the inductor and the capacitor.

It may be appreciated that an improvement effect of the Q factor is increased in a case in which the magnetic metal layer is provided, particularly in a low frequency region.

Figure 15:
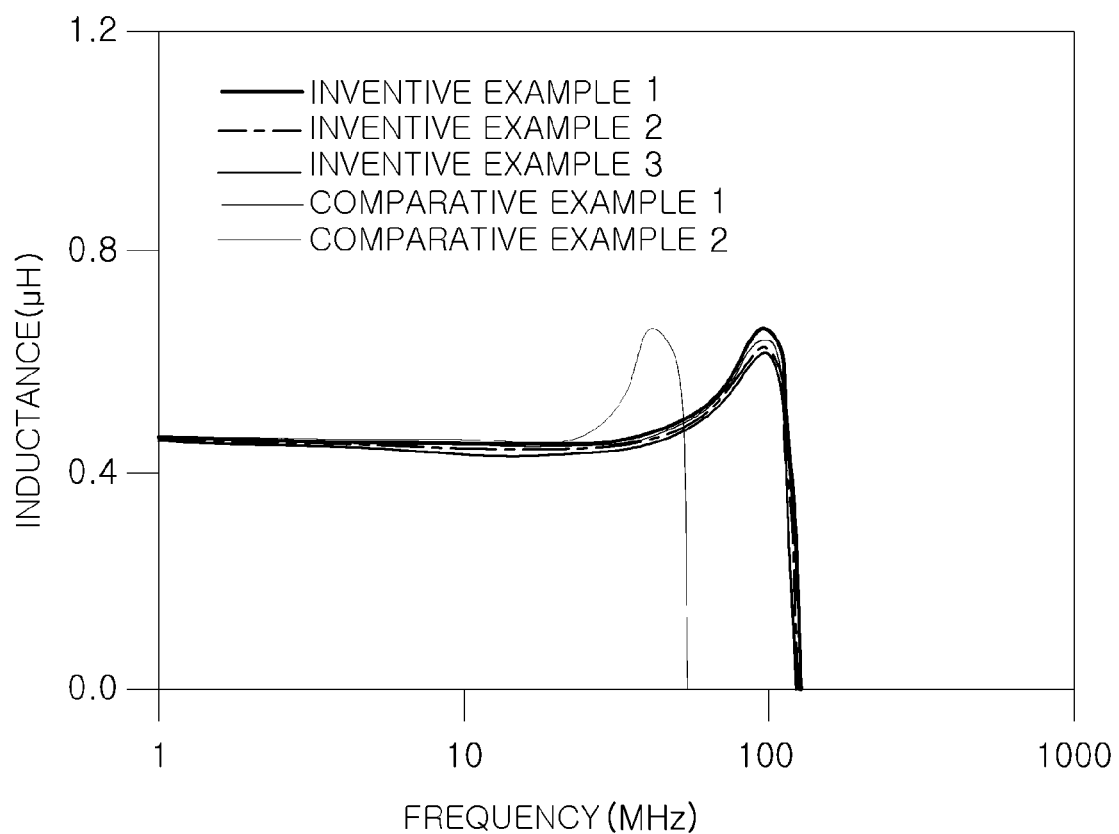
FIG. 15 is a graph illustrating changes in self resonant frequencies (SRF) according to Inventive Examples and Comparative Examples.

FIG. 15 is a graph illustrating changes in SRFs according to Inventive Examples and Comparative Examples.

Referring to FIG. 15, Inventive Example 1 illustrates a case in which a magnetic metal layer having a thickness of 100 μm is provided between an inductor and a capacitor of a composite electronic component, Inventive Example 2 illustrates a case in which a magnetic metal layer having a thickness of 200 μm is provided between an inductor and a capacitor of a composite electronic component, Inventive Example 3 illustrates a case in which a magnetic metal layer having a thickness of 300 μm is provided between an inductor and a capacitor of a composite electronic component, Comparative Example 1 illustrates a case in which a power inductor is used alone, and Comparative Example 2 illustrates a case in which a magnetic metal layer is not provided between an inductor and a capacitor of a composite electronic component.

Referring to the graph of FIG. 15, it may be appreciated that SRFs in Inventive Examples 1 to 3 in which the magnetic metal layer is provided are substantially the same as that in Comparative Example 1 in which the power inductor is singly used.

On the other hand, it may be appreciated that in Comparative Example 2 in which the magnetic metal layer is not provided, an SRF moves to a low frequency region, such that a usable range of the inductor is limited.

Figure 16:
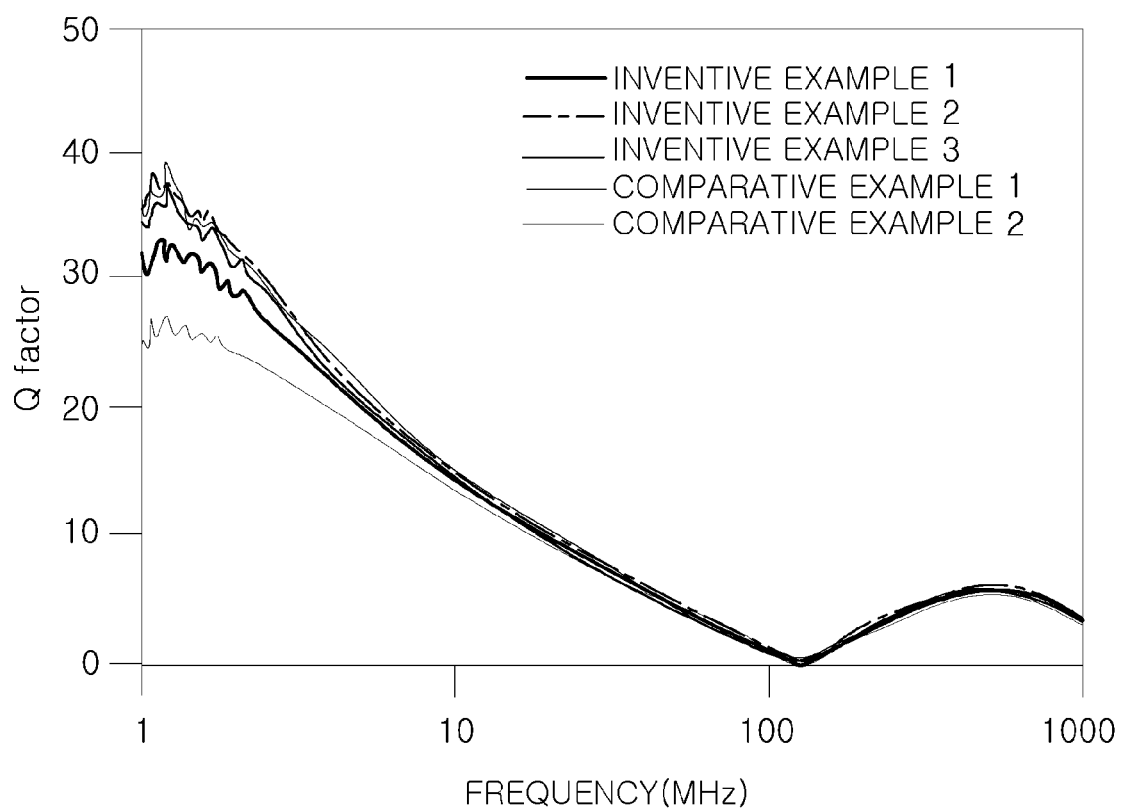
FIG. 16 is a graph illustrating changes in quality (Q) factors according to Inventive Examples and Comparative Examples.

FIG. 16 is a graph illustrating changes in Q factors according to Inventive Examples and Comparative Examples.

Referring to FIG. 16, Inventive Example 1 illustrates a case in which a magnetic metal layer having a thickness of 100 μm is provided between an inductor and a capacitor of a composite electronic component, Inventive Example 2 illustrates a case in which a magnetic metal layer having a thickness of 200 μm is provided between an inductor and a capacitor of a composite electronic component, Inventive Example 3 illustrates a case in which a magnetic metal layer having a thickness of 300 μm is provided between an inductor and a capacitor of a composite electronic component, Comparative Example 1 illustrates a case in which a power inductor is used alone, and Comparative Example 2 illustrates a case in which a magnetic metal layer is not provided between an inductor and a capacitor of a composite electronic component.

Referring to the graph of FIG. 16, it may be appreciated that Q factors in Inventive Examples 1 to 3 in which the magnetic metal layer is provided are substantially the same as that of Comparative Example 1 in which the power inductor is used alone.

On the other hand, it may be appreciated that a Q factor is deteriorated in Comparative Example 2 in which the magnetic metal layer is not provided as compared with in Inventive Examples 1 to 3 in which the magnetic metal layer is provided and Comparative Example 1 in which the power inductor is used alone.

As set forth above, according to the exemplary embodiments in the present disclosure, the composite electronic component able to be mounted in a decreased area in the driving power supply system may be provided.

In addition, according to the exemplary embodiments in the present disclosure, the composite electronic component capable of suppressing the generation of noise in the driving power supply system may be provided.

Further, in the composite electronic component according to the exemplary embodiment in the present disclosure, the magnetic metal layer may be provided between the inductor and the capacitor or be disposed on the cover layer of the inductor adjacent to the capacitor to decrease a deterioration phenomenon of the component due to a parasitic capacitance.

Further, in the composite electronic component according to the exemplary embodiment in the present disclosure, the magnetic metal layer may be provided between the inductor and the capacitor or be disposed on the cover layer of the inductor adjacent to the capacitor to prevent eddy loss.

While the present disclosure has been shown and described in connection with the embodiments, it will be apparent to those skilled in the art that modifications and variations could be made without departing from the scope of the present invention as defined by the appended claims.

What is claimed is:

1. A composite electronic component comprising:
a composite body in which a capacitor and an inductor are coupled to each other, the capacitor including a ceramic body in which a plurality of dielectric layers and first and second internal electrodes, having respective dielectric layers interposed therebetween and facing each other, are stacked, and the inductor including a magnetic body including a coil part;
an input terminal disposed on a first end surface of the composite body in a length direction and connected to the coil part of the inductor;
an output terminal including first output terminals disposed on a second end surface of the composite body in the length direction and connected to the coil part of the inductor and a second output terminal disposed on a second side surface of the composite body in a width direction and connected to the first internal electrodes of the capacitor; and
a ground terminal disposed on a first side surface of the composite body in the width direction and connected to the second internal electrodes of the capacitor,
wherein the capacitor and the inductor are coupled to each other in a vertical direction, and a magnetic metal layer is provided between the inductor and the capacitor.

2. The composite electronic component of claim 1, wherein a thickness of the magnetic metal layer is 50 to 300 µm.

3. The composite electronic component of claim 1, wherein the magnetic metal layer contains one or more of a metal powder, a metal flake, and ferrite.

4. The composite electronic component of claim 3, wherein the metal powder and the metal flake contain one or more selected from the group consisting of iron (Fe), an iron-silicon (Fe—Si) alloy, an iron-silicon-aluminum (Fe—Si—Al) alloy, an iron-silicon-chromium (Fe—Si—Cr) alloy, and a nickel-iron-molybdenum (Ni—Fe—Mo) alloy.

5. The composite electronic component of claim 1, wherein the magnetic body has a form in which a plurality of magnetic layers having conductive patterns are stacked, the conductive patterns configuring the coil part.

6. The composite electronic component of claim 1, wherein the inductor has a thin film form in which the magnetic body includes an insulating substrate and coils of the coil part are disposed on at least one surface of the insulating substrate.

7. The composite electronic component of claim 1, wherein the magnetic body has a form in which the coil part includes a core and winding coils wound around the core.

8. The composite electronic component of claim 1, wherein the capacitor and the inductor are coupled to each other by a conductive adhesive disposed on one of an upper surface and a lower surface of the magnetic metal layer.

9. The composite electronic component of claim 1, wherein the input terminal is configured by coupling an external electrode disposed on a first end surface of the magnetic body in the length direction and an external electrode disposed on a first end surface of the ceramic body in the length direction to each other.

10. The composite electronic component of claim 1, wherein the first output terminals are configured by coupling an external electrode disposed on a second end surface of the magnetic body in the length direction and an external electrode disposed on a second end surface of the ceramic body in the length direction to each other.

11. A printed circuit board having the composite electronic component of claim 1, comprising:
three or more electrode pads disposed on the printed circuit board;
the composite electronic component installed on the printed circuit board; and
solders connecting the electrode pads and the composite electronic component to each other.

12. A composite electronic component comprising:
a composite body in which a capacitor and an inductor are coupled to each other, the capacitor including a ceramic body in which a plurality of dielectric layers and first and second internal electrodes, having respective dielectric layers interposed therebetween and facing each other, are stacked, and the inductor including a magnetic body including a coil part;
an input terminal disposed on a first end surface of the composite body in a length direction and connected to the coil part of the inductor;
an output terminal including first output terminals disposed on a second end surface of the composite body in the length direction and connected to the coil part of the inductor and a second output terminal disposed on a second side surface of the composite body in a width direction and connected to the first internal electrodes of the capacitor; and
a ground terminal disposed on a first side surface of the composite body in the width direction and connected to the second internal electrodes of the capacitor, wherein the capacitor and the inductor are coupled to each other in a vertical direction, the inductor includes the coil part and cover layers disposed on upper and lower surfaces of the coil part, respectively, and a magnetic metal layer is disposed on the uppermost portion of the cover layer adjacent to the capacitor.

13. The composite electronic component of claim 12, wherein the inductor has a thin film form in which the magnetic body includes an insulating substrate and coils of the coil part are disposed on at least one surface of the insulating substrate.

14. The composite electronic component of claim 12, wherein the capacitor and the inductor are coupled to each other by a conductive adhesive.

15. The composite electronic component of claim 12, wherein the magnetic body of the inductor has a form in which a plurality of magnetic layers having conductive patterns are stacked, the conductive patterns configuring the coil part.

16. A printed circuit board having the composite electronic component of claim 12, comprising:
three or more electrode pads disposed on the printed circuit board;
the composite electronic component installed on the printed circuit board; and
solders connecting the electrode pads and the composite electronic component to each other.

17. A composite electronic component used in a power supply terminal of a portable mobile apparatus, suppressing an alternating current (AC) component of received power, and decreasing ripple, the composite electronic component comprising:
a power stabilizing unit including a composite body in which a capacitor and an inductor are coupled to each other and a magnetic metal layer is provided between the inductor and the capacitor, the capacitor including a ceramic body in which a plurality of dielectric layers and first and second internal electrodes, having respective dielectric layers interposed therebetween, are stacked and the inductor including a magnetic body including a coil part;
an input terminal disposed on a first end surface of the power stabilizing unit in a length direction and receiving power converted by a power managing unit;
an output terminal including first and second output terminals disposed on a second end surface of the power stabilizing unit in the length direction and a second side surface of the power stabilizing unit in a width direction and supplying the power stabilized by the power stabilizing unit; and
a ground terminal disposed on a first side surface of the power stabilizing unit in the width direction and connected to the second internal electrodes of the capacitor,
wherein the inductor suppresses the AC component of the received power and the capacitor decreases ripple in the received power.

18. The composite electronic component of claim 17, wherein the magnetic metal layer contains one or more of a metal powder, a metal flake, and ferrite.

19. The composite electronic component of claim 18, wherein the metal powder and the metal flake contain one or more selected from the group consisting of iron (Fe), an iron-silicon (Fe—Si) alloy, an iron-silicon-aluminum (Fe—Si—Al) alloy, an iron-silicon-chromium (Fe—Si—Cr) alloy, and a nickel-iron-molybdenum (Ni—Fe—Mo) alloy.

20. The composite electronic component of claim 17, wherein a thickness of the magnetic metal layer is 50 to 300 µm.

* * * * *